United States Patent [19]

Born et al.

[11] 4,306,266
[45] Dec. 15, 1981

[54] CIRCUIT ARRANGEMENT FOR DETERMINING THE REACTANCE OF A POWER TRANSMISSION LINE IN THE EVENT OF A SHORT CIRCUIT

[75] Inventors: Eckhard Born; Jörg Schaale, both of Berlin, Fed. Rep. of Germany

[73] Assignee: Siemens Aktiengesellschaft, Berlin and Munich, Fed. Rep. of Germany

[21] Appl. No.: 123,121

[22] Filed: Feb. 20, 1980

[30] Foreign Application Priority Data

Feb. 28, 1979 [DE] Fed. Rep. of Germany ....... 2907857

[51] Int. Cl.³ .............................................. H02H 7/26
[52] U.S. Cl. ........................................ 361/80; 324/59; 361/67
[58] Field of Search .............. 361/80, 81, 79, 82, 361/67; 324/52, 57 R, 59

[56] References Cited

U.S. PATENT DOCUMENTS 3,312,866 4/1967 Rockefeller, Jr. ............... 361/80 X
3,723,864 3/1973 Ricard ............................. 361/80

*Primary Examiner*—Patrick R. Salce
*Attorney, Agent, or Firm*—Kenyon & Kenyon

[57] ABSTRACT

A circuit arrangement for determining the reactance of a power transmission line in the event of a short circuit from first and second measurement valves proportional to the short circuit current and voltage respectively, in which, in order to perform this determination, in a very short time, the circuit arrangement contains a phase shifter in which, from the first measurement variable an auxiliary measurement variable which lead the first measurement variable approximately by a phase angle corresponding to the phase difference between the current and voltage in the case of a metallic short circuit is formed and switches used to couple the auxiliary measurement variable and the second measurement variable to an evaluation arrangement for determining the phase angle and to an arrangement for storing the maximum value of the measurement variables which two arrangements are followed by a computer which computes the reactance from the phase angle and stored maximum values.

13 Claims, 4 Drawing Figures

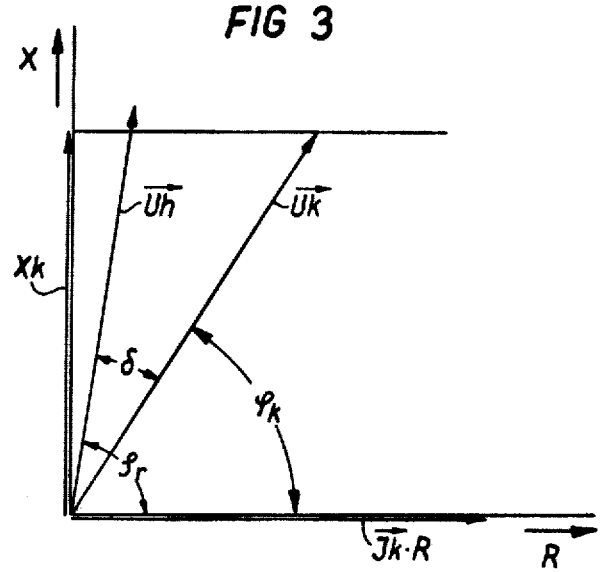
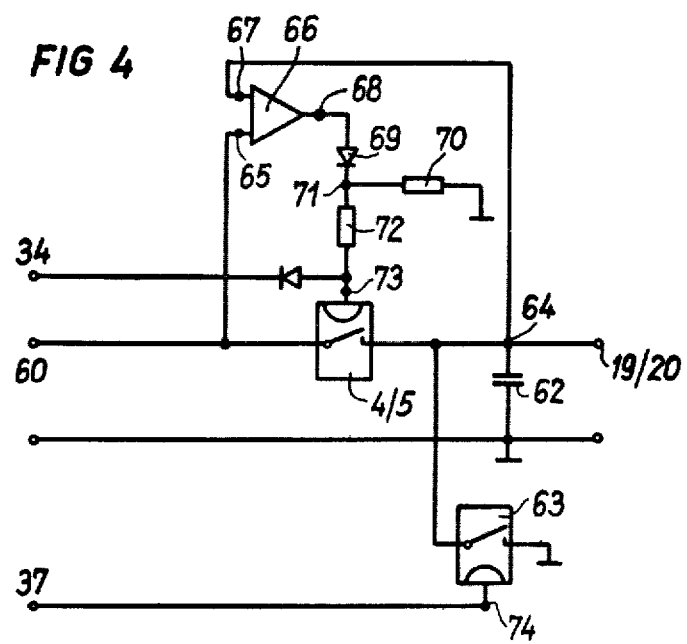

4,306,266

CIRCUIT ARRANGEMENT FOR DETERMINING THE REACTANCE OF A POWER TRANSMISSION LINE IN THE EVENT OF A SHORT CIRCUIT

BACKGROUND OF THE INVENTION

This invention relates to power transmission lines in general and more particularly to a circuit arrangement for determining the reactance of a power transmission line in the event of a short circuit.

In selective protection engineering, it has been known for a long time that the distance of the fault location from the installation site can be determined by measurement of the resistance of a power transmission line between the installation site of a protective arrangement and the location of a fault, since the resistance is proportional to the distance. It is further known from the literature to measure the reactance of the power transmission line between the installation site of the protective arrangement and the short circuit; if the reactance is measured, it has the advantage that the determination of the short circuit location is only slightly influenced by the arc resistance or by the resistance to ground. The reactance Xk of a power transmission line can be described by the following equation:

$$Xk = \frac{|\hat{U}k|}{|\hat{I}k|} - \sin \phi \, k \qquad (1)$$

In this equation $|\hat{U}k|$ gives the peak value of the short circuit voltage on the transmission line and $|\hat{I}k|$ the peak value of the short circuit current in the transmission line as measured at the installation site of the protective arrangement; the phase angle between the short circuit voltage and the short circuit current is designated as $\phi \, k$.

In order to determine the reactance of the line in the event of a short circuit for determining the location of the short circuit on a power transmission line, it is therefore necessary to determine $|\hat{U}k|$, $|\hat{I}k|$ and $\sin \phi \, k$ as well as to interlink these variables mathematically. With the present state of the art in electronic circuits, this can be done without difficulty if sufficient time is provided therefor.

It is an object of the present invention to provide a circuit arrangement for determining the reactance of a power transmission line in the event of a short circuit, by which the reactance and therefore also the short circuit can be determined in a very short time from the measurement variables $|\hat{U}k|$ and $|\hat{I}k|$; this is desirable so that the reactance and therefore also the short circuit can be determined exactly and with certainty in the short time period before the following circuit breakers open, after an excitation circuit has responded in the event of a short circuit or an associated protective device has delivered a tripping signal.

SUMMARY OF THE INVENTION

To solve this problem, the present invention starts out from a circuit arrangement for determining the reactance of a power transmission line in the event of a short circuit, to which a measuring variable derived from the short circuit voltage at the power transmission line, and a further measurement variable derived from the short circuit current in the power transmission line are fed.

According to the present invention, the circuit arrangement contains a phase shifter at its input in which an auxiliary measurement variable is formed from the one measurement variable. The auxiliary measurement variable leads the one measurement variable by a phase angle corresponding to the phase difference between the current and voltage in the case of a metallic short circuit. By means of switches operated in the event of a short circuit, an evaluation arrangement for forming an output variable depending on the phase angle between the two measurement variables and an arrangement for storing the maximum value of the other measurement variable and the auxiliary measurement variable are connected to the output of the phase shifter and to the other measurement variable. The output of the arrangement for storing the maximum value and the output of the evaluation arrangement are connected to a computer.

The essential advantage of the circuit arrangement according to the present invention for determining the reactance is found in the use of an auxiliary measurement variable which leads the one measurement variable by a phase angle corresponding to approximately the phase difference between current and voltage in the case of a metallic short circuit, so that the auxiliary measurement variable is then always already generated before the determination of the reactance and the location of the short circuit starts, and no additional time loss occurs in forming this valve. Through the chosen phase shift of the one measurement variable, the auxiliary measurement variable and the other measurement variable, as a rule, differ only slightly from each other as to phase at the start of the determination of the reactance, so that maximum values of the variables can be determined in a short time, i.e., nearly simultaneously, and can be stored.

The circuit arrangement according to the present invention is found to also be advantageous with respect to determining the output variable which is dependent on the phase angle between the two measurement variables because, due to the evaluation of the auxiliary measurement variable, the phase angle between the auxiliary measurement variable and the other measurement variable is as a rule relatively small and can therefore likewise be determined in a short time.

Thus the maximum values of current and voltage of the power transmission line and also a variable dependent on the phase angle between them can be determined quickly by means of the circuit arrangement according to the present invention in the event of a short circuit, and the reactance and the location of the short circuit can therefore be determined in a short time, using a simple computer.

In order to avoid inaccuracies in the determination of the reactance and the location of the short circuit, respectively, due to interference quantities of other than line frequency, such as occur particularly in longer compensated transmission lines in the high voltage grid, the switches are preceded by bandpass filters tuned to the network frequency with identical electrical characteristics. Therefore, the auxiliary measurement variable is present at the input of the one bandpass filter, and the other measurement variable at the input of the other bandpass filter. Accordingly, both bandpass filters are, as a rule, fed with variables of about the same phase and therefore exhibit identical transient behavior, so that the bandpass filters do not appreciably lengthen the time required for the determination of the reactance.

It has further been found to be advantageous for the evaluation device to contain two squarewave formers in its input circuit, one of which generates a squarewave corresponding to the auxiliary measurement variable at its output and the other of which generates another squarewave corresponding to the other measurement variable; the outputs of the two squarewave forms are connected to an Exclusive OR gate, which is followed by a transformation arrangement which generates an output variable which is dependent on the phase angle between the two measurement variables.

The transformation arrangement advantageously contains a generator at its input which generates a number of pulses at its output during the time of an output signal of the Exclusive OR gate. The generator is followed by a counter. However, the transformation arrangement can also be designed differently, but the design described appears to be particularly advantageous as to cost.

In one embodiment of the circuit arrangement according to the present invention, the output of the counter is connected directly to a multiplexer; in that case the multiplexer receives a variable which is a measure of the phase angle between the other measurement variable and the auxiliary measurement variable and is therefore also dependent on the phase angle between the one and the other measurement variable. The reactance and the location of the short circuit can be determined thereby only in approximation, however, but in many cases with sufficient accuracy.

If a still more accurate determination of the reactance is desired, for instance, in the case of relatively short line sections, then a PROM is advantageously connected to the counter and generates an output variable which corresponds to the sine of the phase angle between the two measurement variables at its output. In this case the value of the sine between the short circuit voltage and the short circuit current is therefore entered into the computer accurately via the multiplexer and is taken into consideration in determining the reactance.

The arrangement for storing maximum values can be of different designs. However, it is considered advantageous if it contains two maximum value storage devices, one of which is connected to one switch and the other to the other switch of the circuit arrangement according to the present invention.

Each maximum value storage device can in turn be of different design. It appears advantageous to equip the circuit arrangement according to the present invention with maximum value storage devices comprising a capacitor which is shunted by a switch, and a comparator, the inputs of which are connected to one lead of the capacitor and to an input terminal of the circuit arrangement, the capacitor with its one lead being connected via another switch to the one input terminal of the circuit arrangement and the output of the comparator being connected to the operating input of the other switch.

The advantage of using a maximum value storage device of this type is that the stored maximum value corresponds to the actual maximum value to a very high degree, because the properties of the electronic components involved have practically no influence on the quality of the storage.

In the circuit arrangement according to the present invention, the output of the comparators can be linked to the input of the other switch in different ways; it is considered advantageous if the operating input of the other switch is connected via a resistor to a tap of a voltage divider connected to the output of the comparator. This kind of circuit connection between the output of the comparator and the operating input of the other switch has the advantage that the operating input of the other switch can be connected via a diode to the output of a control device and the operating input of the one switch can be connected to another output of the control device.

If the control device is connected to the output of an excitation circuit or of a distance protection arrangement, then the discharge of the capacitors of the maximum value storage devices as well as the storing process of the auxiliary measurement variable and the other measurement variable can proceed automatically in a predetermined manner.

In the circuit arrangement according to the present invention, each maximum value storage device can contain an analog to digital converter. For simplifying the circuit, however, it appears more advantageous to use an analog to digital converter which can be coupled via a double throw switch at its input to the outputs of the two maximum value storage devices.

BRIEF DESCRIPTION OF THE DRAWINGS

FIG. 3 is a vector diagram for explaining the operation of the circuit arrangement according to the present invention.

FIG. 4 is a circuit diagram of a maximum value storage device which can be used in the embodiment of FIG. 1.

DETAILED DESCRIPTION OF THE INVENTION

Figure 1:
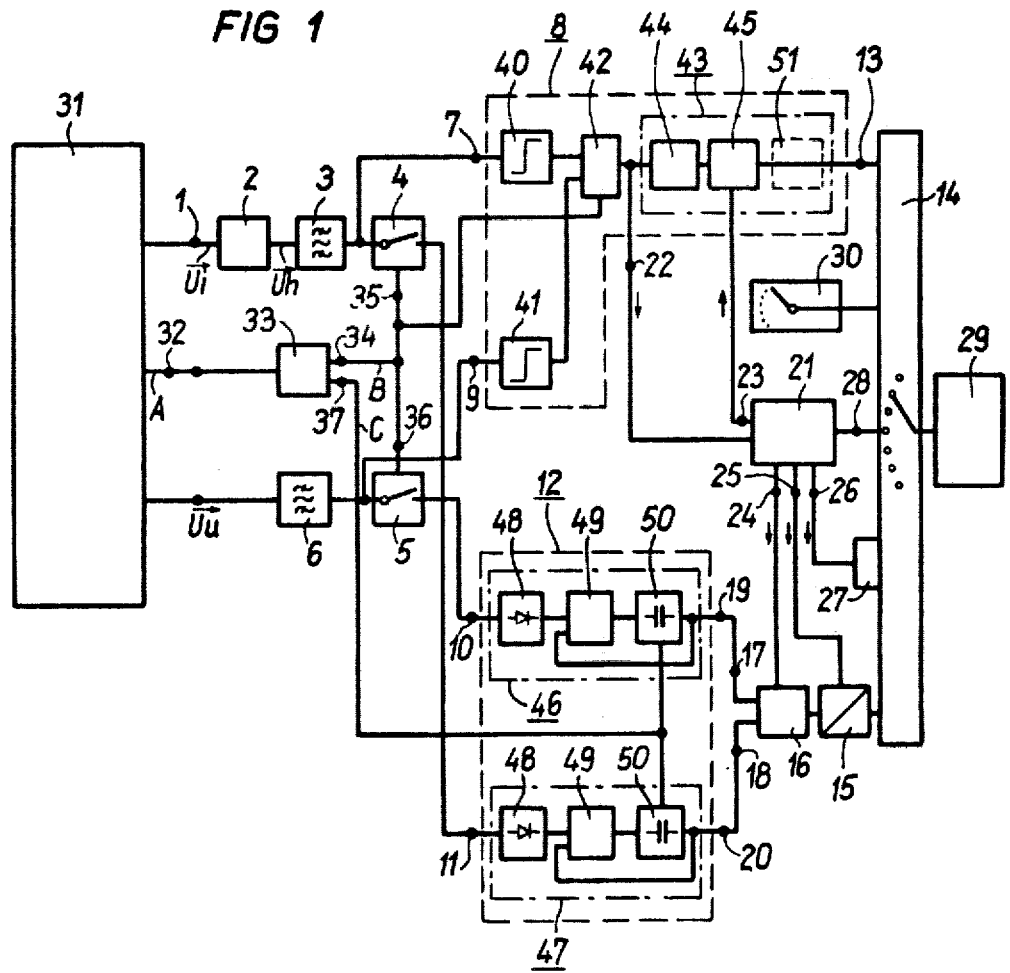
FIG. 1 illustrates the circuit arrangement according to the present invention in the form of a block diagram.

To one input 1 of the circuit arrangement according to the present invention, a measurement variable Ui is applied which is derived from the short circuit current in the power transmission line to be monitored (not shown). The input 1 is connected to a phase shifter 2, in which an auxiliary measurement variable Uh is formed from the one measurement variable Ui. The auxiliary measurement variable Uh leads the one measurement variable Ui by a phase angle which corresponds to the phase difference between the short circuit current and the short circuit voltage at the power transmission line in the case of a metallic short circuit; advantageously the auxiliary variable Uh leads the one measurement variable Ui by about 80° in view of practical conditions.

The phase shifter 2 is followed by a bandpass filter 3, the output of which is connected to a switch 4. Another switch 5 is preceded by another bandpass filter 6, the transfer characteristic of which corresponds to that of the one bandpass filter 3. To the input of the further bandpass filter 6 another measurement variable Uu which is derived from the short circuit voltage on the transmission line is applied. The switches 4 and 5 can be designed as shown in the RCA handbook "RCA COS/MOS Integrated Circuits," 1977, pages 91 ff.

The one switch 4 is connected to one input 7 of an evaluating arrangement 8. A further input 9 of the evaluating arrangement 8 is connected to the other switch 5. In addition, inputs 10 and 11 of an arrangement 12 for storing maximum values are connected to the switches 4 and 5.

One output 13 of the evaluation arrangement 8, at which an output variable which is dependent on the phase angle between the measurement variables Ui and Uu appears, is connected to a multiplexer 14, for instance, in accordance with RCA handbook "COS/MOS Integrated Circuits" 1977, pages 165 ff. To the input of the multiplexer 14 is furthermore connected an analog to digital converter arrangement which, in the illustrated embodiment, consists of a single analog to digital converter 15, for instance, Building Block CMOS 8750 in accordance with the publication "CMOS 8750 Monolithic Analog-to-Digital Converter, 3½ Digits with BCD Outputs" made by Teledyne Semiconductor. This analog to digital converter is preceded by a double throw switch 16 which is advantageously an electronic double throw switch, the inputs 17 and 18 of which are connected to outputs 19 and 20 of the arrangement 12 for storing maximum values. The same electronic building block as that used for the switches 4 and 5 can be used for switch 16.

The circuit arrangement shown also contains a control mechanism 21 which is fed from an output 22 of the evaluation arrangement 8 and, in turn, feeds back to the evaluation arrangement 8 via an output 23. The control mechanism, by means of further outputs 24, 25 and 26, controls the double throw switch 16, the analog to digital converter 15 and a switch 27 for activating the multiplexer 14. An additional output 28 of the control mechanism 29 is connected directly to the multiplexer 14. The multiplexer 14 is followed by a computer 29, from which the location of the fault can be read in percent of the line section to be monitored on the basis of a factor generator 30 which is likewise connected to the multiplexer 14. The computer 29 is formed, for instance, by a BCD arithmetic unit in accordance with an Application Report "BCD Arithmetic Unit TMSO 117 NC" of the firm Texas Instruments Germany GmbH.

In the illustrated embodiment, the circuit arrangement according to the present invention is associated with a distance protection device 31 which not only delivers the one measurement variable Ui and the other measurement variable Uu but also generates, at its output 32, in the event of a short circuit, a tripping signal for associated circuit breakers, not shown in the figure. A control device 33 for the circuit arrangement according to the present invention is connected to the output 32. One output of control device 33 is connected to an operating input 35 of the one switch 4 and to an operating input 36 of the other switch 5, and the other output 37 is connected to the arrangement 12 for storing maximum values.

The evaluation arrangement 8 has at its input two squarewave formers 40 and 41 (see, for instance, RCA Handbook "COS/MOS Integrated Circuits" 1977, pages 154 ff.) which generate at their outputs squarewaves corresponding to the zero crossings of the auxiliary measurement variable Uh and of the further measurement variable Uu. The two squarewave formers 40 and 41 are followed by an Exclusive OR gate 42. The Exclusive OR gate 42 can be designed as described in RCA Handbook "COS/MOS Integrated Circuits" 1977, pages 123 ff. One input of the Exclusive OR gate 42 is connected to the output 34 of the control device 33.

A transformation arrangement 43 which contains a synchronous generator 44 at its input is connected to the output of the Exclusive OR gate 42. The synchronous generator 44 can be designed, for instance, as per RCA Handbook "COS/MOS Integrated Circuits" 1977, pages 154 ff. The synchronous generator 44 is followed by a counter 45 which may be, for instance, a counter in accordance with the mentioned RCA Handbook "COS/MOS Integrated Circuits," pages 104 ff. As shown in FIG. 1 by means of the through line, the counter 45 is directly connected to the input 13 of the multiplexer 14, which can be formed by an arrangement according to the above cited RCA Handbook "COS/MOS Integrated Circuits" pages 165 ff.

The arrangement 12 for storing maximum values contains a maximum value storage device 46 and a further maximum value storage device 47. The maximum value storage devices 46 and 47 are of identical design so that the description can be limited to one of them. Each maximum value storage device 46 and 47 has in its input a rectifier, preferably an active rectifier 48 to which a capacitor 50 is connected via an electronic circuit 49. The respective one connecting point of the capacitor 50 of the one maximum value storage device 46 is connected to the output 19 of the arrangement 12, and the corresponding connecting point of the capacitor 50 of the further maximum value storage device 47 is connected to the output of the arrangement 12.

Further details of the circuit arrangement according to the present invention as shown in FIG. 1 will be explained in greater detail in explaining its operation.

Figure 2:
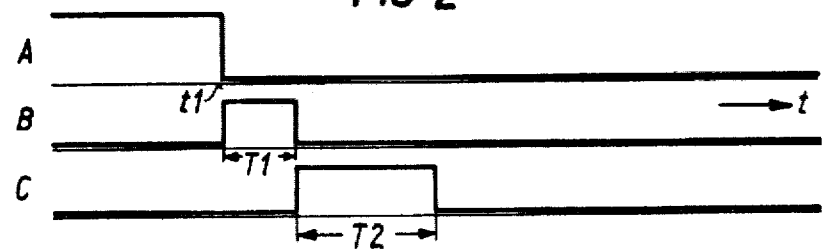
FIG. 2 is a timing diagram to explain the operation of the control device of FIG. 1.

If the distance protection arrangement 31 detects a fault on the power transmission line to be monitored, it generates a tripping signal at its output 32, the waveform of which is given in diagram A of FIG. 2. The tripping signal appearing at the time t1 activates control device 33 which generates a signal for a duration T1 at its output 34 (see diagram B of FIG. 2).

In response to the signal according to diagram B, the capacitors 50 of the two maximum value storage devices 46 to 47 are discharged, as will be explained in greater detail in connection with the explanation of FIG. 4, and the counter 45 is reset in a manner not shown. At the end of the time T1 a further signal (see diagram C of FIG. 2) is generated at the output 37 of the control device 33 for a time T2. This signal enables the two maximum value storage devices 46 and 47 for the time T2 for storing the maximum values of the auxiliary voltage Uh and the other measurement variable Uu. This is accomplished by closing the switches 4 and 5 with the signal at the output 34.

Simultaneously with the storage of the maximum values of the auxiliary variable Uh and the other measurement variable Uu, corresponding square waves are generated from these measurement variables by means of the squarewave formers 40 and 41 and these are evaluated in the Exclusive OR gate 42. At the output of the Exclusive OR stage an output signal proportional to the time between similar zero crossings of the two squarewaves is therefore obtained. This output signal is, as a rule, short since the phase angle between the auxiliary measurement variable Uh and the other measurement variable Uu is small because the phase shifter 2 is used. Thereby, an output variable which depends on the phase angle between the auxiliary measurement variable Uh and the other measurement variable Uu or between the one measurement variable Ui and the other measurement variable Uu, is obtained at the output of the counter 45 or the input 13 of the multiplexer 14, respectively, not later than after one half wave of the measurement variables. With this output variable and the maximum values of the auxiliary measurement variable Uh and the other measurement variable Uu stored during the period T2, the reactance and thereby, the location of the short circuit can be determined by means of the computer 29. This is based on the following situation:

In FIG. 3 are shown in a R-X diagram the voltage drop $\vec{Ik}.R$ caused by the short circuit current $\vec{Ik}$, and the short circuit voltage $\vec{Uk}$; both vectors enclose a phase angle $\phi k$ which represents the phase angle between current and voltage of the line in the event of a short circuit. In addition, the auxiliary measurement variable $\vec{Uh}$ which forms a phase angle $\phi r$ with the abscissa, is shown in the vector diagram. This angle corresponds approximately to the phase angle of the impedance of the power transmission line in the case of a metallic short circuit. The size of the phase angle $\phi r$ is advantageously selected to be about 80°, as already mentioned above.

Under consideration of Eq. (1) mentioned at the outset and under the assumption that $$\phi k = 100 \ r, \quad (2)$$

where $\phi k$, takes into consideration a possible arc voltage, the following relation (3) can be established:

$$\phi k = \phi r - \delta. \quad (3)$$

where $\delta$ describes the phase angle between $\vec{Uh}$ and $\vec{Uk}$.

Further taking into consideration that a simulation $Z_n \cdot e^{j\phi r}$ is used for forming the auxiliary measurement variable $\vec{Uh}$, the auxiliary measurement variable $\vec{Uh}$ can be described mathematically by the following equation (4):

$$\vec{Uh} = \vec{Ik} \ Z \ e^{j\phi r} \quad (4)$$

with $$|In \cdot R| = |Ik \cdot Z_n|, \quad (5)$$

Eq. (1) can also be written as follows:

$$X_k = \frac{|\hat{Uk}|}{|\hat{Uh}|} \cdot R \cdot [\sin(\phi_r \cdot \delta)] \quad (6)$$

It follows from this equation with $\phi r - 80°$ using the well known addition theorems for Xk, $$X_k = C \frac{|\hat{Uk}|}{|\hat{Uh}|} (\cos \delta - k (\delta) \sin \delta) \quad (7)$$

For small angles $\delta$, which are as a rule given due to the position of the auxiliary measurement variable $\vec{Uh}$, and for a permitted error in determining the location of the short circuit of, say less than 3%, the reactance Xk can also be represented by Eq. (8)

$$X_k = \left( \frac{|\hat{Uk}|}{|\hat{Uh}|} (1 - k (\delta) \sin \delta \right) \quad (8)$$

Since o is equal to the phase difference between the auxiliary measurement variable $\vec{Uh}$ and the other measurement variable $\vec{Uu}$ and therefore, of successive zero crossings of the squarewave at the outputs of the squarewave formers 40 and 41 and therefore of the duration of the output variable at the Exclusive OR gate 42, or corresponds to the reading of the counter 45, the short circuit can be determined with sufficient accuracy from the stored maximum values of the two measurement variables Uh and Uu and the counter reading of the counter 45 in the computer 29, after introduction of a predeterminable correction term K ($\delta$).

This applies in particular to the main applications of the circuit arrangement according to the present invention for determining the location of the short circuit on power transmission lines with larger distances between stations; while values somewhat over 80° can also occur here for $\phi k$, for which the approximation formula likewise leads to sufficiently accurate results, larger deviations occur only for shorter distances between stations or in the case of very large ground resistances.

For those cases where the reactance or the location of the short circuit according to Eq. (1) is to be determined more accurately, the counter N is followed, as shown in FIG. 1 by dashed lines, by a PROM 51 which may be designed, for instance, as described in Siemens Data Book 1976/1977 "Microprocessor Building Blocks System SAB 8080," pages 221 ff. By means of this PROM 51, an output variable can be generated at the input 13 of the multiplexer 14, which corresponds to the sine of the phase angle $\phi k$ between the short circuit current and the short circuit voltage, so that in this case the reactance and therefore also the location of the short circuit can be computed more accurately by the computer.

Each maximum value storage device 46 and 47 of the arrangement 12 for storing the maximum value can be designed as is shown in FIG. 4. The rectifier 48 is omitted and the switch 4 or 5 respectively, according to FIG. 1 is included in the presentation. To the input terminal 60 connected to the output of the rectifier 48, one lead of a capacitor 62 is connected. The capacitor is shunted by a switch 63. The switch 4 or 5, respectively, is arranged between the input terminal 60 and the one lead 64 of the capacitor 62. An input 65 of a comparator 66 is connected to the one input terminal 60. The other input 67 of comparator 66 is connected to the one lead of the capacitor 62.

A voltage divider consisting of a diode 69 and a resistor 70 is connected to the output 68 of the comparator 66. The common circuit point 71 of the diode 69 and the resistor 70 and, therefore, the tap of the voltage divider, is connected via a further resistor 72 to an operating input 73 of the switch 4 or 5 respectively.

The output 34 of control device 33 (see FIG. 1) is also connected to the operating input 73 of the switch 4 or 5 through a diode 34. The further output 37 of the control device 33 is connected to an operating input 74 of the switch 63.

The maximum value storage device shown operates as follows:

First, a signal (signal B as per FIG. 2) is provided by the control device 33 via the output 37 to the operating input 74 of the switch 63 for a brief time, whereby the switch 63 is closed and the capacitor 62 is thereby discharged. A signal does not appear during this time T1 at the output 37 of the control device 33, so that the switch 4 or 5 cannot be controlled by the comparator 66, regardless of the voltage condition at the input terminal 60 and the one lead 64 of the capacitor 62, because the line 34 is held at ground through the diode.

Only if a signal (signal C) appears at the output 37 of the control device 33 after the capacitor 62 is discharged, can the switch 4 or 5 can be controlled from the comparator 66. The switch 4 or 5 is controlled via the comparator 66 in dependence on the voltage difference at the input terminal and at the one lead 64 of the capacitor 62. Initially, the voltage at the input terminal 60 will be higher than that at the lead 62 so that the comparator 66 generates an output signal and the switch 4 or 5 operated thereby. Consequently, the capacitor 62 can be charged. The charging process continues as long as the voltage at point 64 and therefore, at the capacitor 62 is smaller than the instantaneous value of the voltage Uh and Uu at the input terminal 60 respectively, to be stored when no voltage difference is present between the input terminal 60 and the lead 64, the signal at the output 68 of the comparator 66 disappears, and the switch 4 or 5 opens. Thereby, the maximum value of the voltage at the input 60 is stored in the capacitor 62.

The switch 4 or 5 remains open as long as no signal is given by the comparator 66 at the operating terminal 73 of the switch 4 or 5 during the signal C at the output 37 of the control device 33. If during the presence of the signal C at the output 37 of the control device 33 a maximum value larger than the one already stored occurs at the input 60, then the switch 4 or 5, respectively, is closed again and the capacitor 62 is charged to this higher maximum value; this value then corresponds to the higher maximum value of the voltage at the input 60. At the outputs 19 and 20, respectively, of the maximum value storage devices 46 and 47, voltages which correspond to the maximum value of the measurement variables Uh and Uu respectively during the presence of a signal at the output 37 of the control device 33C and therefore be taken off.

With a new signal at the operating input 74 of the switch 63, the capacitor 62 is discharged again and the storing of a new maximum value can begin in the manner described above.

What is claimed is:

1. A circuit arrangement for determining the reactance of a power transmission line in the event of a short circuit comprising:
   (a) means for coupling to said circuit arrangement a first measurement variable derived from the short circuit current in the power transmission line and a second measurement variable derived from the short circuit voltage on the power transmission line;
   (b) a phase shifter having said first measurement variables as an input and providing at its output an auxiliary measurement variable which leads its input approximately by a phase angle corresponding to the phase difference between the current and voltage in the case of a metallic short circuit;
   (c) first and second switches, coupled to be actuated in the event of a short circuit having as inputs the second and the auxiliary measurement values respectively for forming an output variable;
   (d) means, having inputs coupled to said switches, for forming an output variable proportional to the phase angle between the first and second measurement variables; and
   (e) means for storing the maximum value of the second measurement variable and the auxiliary measurement variable coupled to the outputs of said switches; and
   (f) computing means having as inputs the output of said means for storing the maximum value and the output of said means for forming.

2. A circuit arrangement according to claim 1, wherein said computing means contains an arithmetic unit and further including an analog to digital converter having as inputs the outputs of said means for storing the maximum value and a multiplexer having as inputs the output of said converter, and the output of said means for forming and providing its output to said computing means.

3. A circuit arrangement according to claim 2 and further including first and second bandpass filters with identical electrical characteristics, tuned to the network frequency, at the inputs of said first and second switches.

4. A circuit arrangement according to claim 3, wherein said means for forming includes two squarewave formers at its input, one generating, at its output a squarewave corresponding to the auxiliary measurement variable and the other generating a squarewave corresponding to the second measurement variable; an Exclusive OR gate having as inputs the outputs of said two squarewave formers and a transformation arrangement obtaining its input from the output of said Exclusive OR gate and providing at its output, an output variable proportional to the phase angle between said first and second measurement variables.

5. A circuit arrangement according to claim 4, wherein said transformation arrangement comprises a generator which generates, at its output, for the duration of an output signal of the Exclusive OR gate, a corresponding number of pulses, and a counter having its input coupled to the output of said generator.

6. A circuit arrangement according to claim 5, wherein the output of said counter is directly connected to said multiplexer.

7. A circuit arrangement according to claim 5, and further including a PROM which generates at its output an output variable corresponding to the sine of the phase angle between the two measurement variables coupled to the output of said counter and providing its output to said multiplexer.

8. A circuit arrangement according to claim 7, wherein said means for storing maximum values comprises two maximum value storage devices, one coupled to said first bandpass filter and the other to said second bandpass filter.

9. A circuit arrangement according to claim 8 wherein each of said maximum storage devices comprises:
   (a) a capacitor;
   (b) a shorting switch shunting said capacitor;
   (c) a comparator;
   (d) one of said first and second switches coupling one lead of said capacitor to the output of its respective bandpass filter, said filter output also coupled to one input of said comparator, the other input of said comparator coupled to said one lead and the output of said comparator coupled to the operating input of said one of said first and second switches.

10. A circuit arrangement according to claim 9, wherein the operating input of said one of said first and second switches is coupled through a resistor to the tap of a voltage divider coupled to the output of said comparator.

11. A circuit arrangement according to claim 10 and further including a control device, and wherein the operating input of said one switch is coupled through a diode to one output of said control device and the operating input of said shorting switch is coupled to a further output of said control device.

12. A circuit arrangement according to claim 11, wherein said control device is coupled to the output of an exciter circuit or a protective arrangement.

13. A circuit arrangement according to claim 12 wherein said analog to digital converter arrangement comprise an analog to digital converter and a double throw switch for selectively coupling the input of said converter to the outputs of the two maximum value storage devices.

* * * * *